(12) United States Patent
Weisleder et al.

(10) Patent No.: US 7,588,637 B2
(45) Date of Patent: Sep. 15, 2009

(54) PRODUCTION OF HIGH-PURITY, LARGE-VOLUME MONOCRYSTALS THAT ARE ESPECIALLY RADIATION-RESISTANT FROM CRYSTAL SHARDS

(75) Inventors: Andreas Weisleder, Tautenhain (DE); Matthias Mueller, Jena (DE); Joerg Kandler, Cospeda (DE); Andreas Menzel, Jena (DE); Rainer Guett, Bad Klosterlausnitz (DE)

(73) Assignee: Schott AG, Mainz (DE)

( * ) Notice: Subject to any disclaimer, the term of this patent is extended or adjusted under 35 U.S.C. 154(b) by 129 days.

(21) Appl. No.: 11/609,626

(22) Filed: Dec. 12, 2006

(65) Prior Publication Data

US 2007/0186844 A1  Aug. 16, 2007

(30) Foreign Application Priority Data

Dec. 13, 2005   (DE)  ............... 10 2005 059 531

(51) Int. Cl.
*C30B 13/28* (2006.01)
(52) U.S. Cl. ............... 117/81; 117/73; 117/82; 117/83; 117/940; 117/943
(58) Field of Classification Search .......... 117/3, 117/4, 11, 81, 82, 83, 940, 943, 73
See application file for complete search history.

(56) References Cited

U.S. PATENT DOCUMENTS

| | | | |
|---|---|---|---|
| 3,282,641 A | 11/1966 | Sfiligoj et al. | |
| 5,376,313 A * | 12/1994 | Kanewske et al. | 264/1.1 |
| 6,969,502 B2 | 11/2005 | Wehrhan et al. | |
| 7,393,409 B2 * | 7/2008 | Ortmann et al. | 117/73 |
| 2003/0089307 A1 | 5/2003 | Wehrhan et al. | |
| 2005/0029470 A1 | 2/2005 | Muehlig et al. | |
| 2005/0211160 A1 * | 9/2005 | Ortmann et al. | 117/81 |
| 2007/0248522 A1 * | 10/2007 | Kuehn et al. | 423/324 |
| 2008/0292535 A1 * | 11/2008 | Ortmann et al. | 423/490 |

FOREIGN PATENT DOCUMENTS

| | | |
|---|---|---|
| DE | 1 291 321 | 3/1969 |
| DE | 1 464 992 | 10/2004 |
| DE | 103 35 457 | 3/2005 |
| DE | 10 2005 044 697 | 3/2007 |
| EP | 1 234 898 | 8/2002 |
| EP | 1 566 469 | 8/2005 |
| WO | 01/64975 | 9/2001 |
| WO | 2005/080948 | 9/2005 |

OTHER PUBLICATIONS

Glastechnische Fabrikationsfehler by Hans Jebsen-Marwedel, Teil I: Werkstoff Und Verfahren Zur Auldeckung Seiner . . . (Glass and Methods for Detecting its Flaws) 1980, pp. 114-115 (With Certified English Translation).

J. C. Stover: "Optical Scattering—Measurement and Analysis", McGraw-Hill, 1990, pp. 14-17 (in English).

Fachbereichstandard (Technical Standard) Optical Glass, Determination of Stress Birefringence, Jan. 1989 (With Certified English Translation).

* cited by examiner

*Primary Examiner*—Felisa C Hiteshew
(74) *Attorney, Agent, or Firm*—Michael J. Striker

(57) ABSTRACT

A method for producing high-purity, large-volume monocrystals that are especially radiation-resistant and have low intrinsic birefringence. From a melt of crystalline raw material, with controlled cooling and solidification, a crystal is generated. As the crystalline raw material, shards and/or waste from already-grown crystals is used, and the re-used raw material 1) upon visual observation in daylight has no color; and
2) upon illumination with a white-light lamp in a darkroom
   a) has no or at maximum a just barely perceivable reddish and/or bluish fluorescence; and
   b) has no or at maximum a just barely perceivable diffuse scattering; and
   c) has no or only slight discrete scattering of at maximum two visually perceivable scattering centers per $dm^3$.

In this way, crystals can be obtained which after tempering have a BSDF value of $<7\times10^{-7}$, an RMS homogeneity after the subtraction of 36 Zernike coefficients of $<15\times10^{-8}$, an SDR-RMS value in the 111 direction of $<0.2$ nm/cm.

8 Claims, No Drawings

PRODUCTION OF HIGH-PURITY, LARGE-VOLUME MONOCRYSTALS THAT ARE ESPECIALLY RADIATION-RESISTANT FROM CRYSTAL SHARDS

BACKGROUND OF THE INVENTION

The invention relates to a method for growing monocrystals from shards of already-grown crystals, to crystals obtained in this way, and to their use as optical elements, especially in photolithography.

The production of crystals, especially for photolithography, is widely known and is described for instance in European Patent Disclosure EP-A 1 259 663. In it, large-volume monocrystals with a uniform orientation are grown from a melt of crystalline raw material, by slowly cooling the temperature of the melt at the bottom of a melting and growing vessel to the temperature of crystallization. Between the bottom of the melting vessel and the opening, a vertically extending axial temperature gradient is applied, and an addition or outflow of heat passing through the side walls is avoided. The crystal orientation is predetermined by means of a germ crystal, which is located in particular in a cooled germ pocket. In the growth and further processing of such crystals into optical elements, the crystals are comminuted, which produces a large quantity of material in the form of waste, breakage, or even defective growths, hereinafter called shards. Until now, these shards have been disposed of, even though they are not toxic, and this increases the production costs.

The attempt has already been made to re-use shards from growing calcium fluoride monocrystals, by evaporating them at a temperature of at least 1100° C. in a vacuum of at maximum $5 \times 10^{-4}$ mbar and condensing them again at a temperature of between 500° C. and 1280° C. Such a method is described in German Patent Disclosure DE 10 2004 008 749 A1.

From glass production, it is known to include shards and breakage in the melt and deliver them to a new use. This not only serves to economize on raw materials but above all also serves to save energy that is otherwise needed for purification and for developing the chemical reactions that then lead to the finished glass melt. In the production of crystals, however, such energy savings are not attained, so that the energy expended for melting the high-purity raw crystal powder used until now and for melting shards is the same. The use of shards to economize on raw materials, however, involves the risk of contamination, so that in complicated, expensive, lengthy growing processes, until now it was preferable to use expensive, high-purity starting materials with a purity of >99.99%, rather than to reprocess such shards.

SUMMARY OF THE INVENTION

The object of the invention is now to furnish crystals that are especially free of scattering and have high homogeneity of their refractive index and low birefringence, that is, low strain double refraction. The invention furthermore has the object of re-using and recycling already used raw material, waste and trimmings from earlier crystal growths.

This object is attained with the characteristics defined in the independent claims.

According to the invention it was found that, not only good crystals can be produced from used shards, but in fact crystals that have an improved, superior laser stability, compared to those obtainable by previous methods, can be produced from them, if the used shards, before being melted, have the properties and characteristics described hereinafter.

These properties and characteristics are expediently determined in raw crystals or samples of raw crystals, expediently after their growth and in particular after the peeling off of the cover layer (growth end) and optionally the cone bottom, but preferably before the crystal is comminuted into individual lens blanks. If in the course of the further production process the volume of a raw crystal that has already been assessed produces further shards, then the previously determined characteristics are ascribed to these shards as well. In principle, it is naturally also possible to classify or assess the various shards individually, if they are of sufficient size.

The term "shards" includes crystal material of the following origin:

Geometric waste, which occurs when material capable of being processed into products is cut out of the volume of an already-grown raw crystal.

Breakage or geometrically damaged crystal material that was created in the further processing of cut-out material into products.

Sample material that is no longer needed.

Produced crystal material which does not meet the specification criteria for certain applications but does meet the specification requirements for re-use as shards.

A raw crystal from which shards for re-use can be obtained is a monocrystal, which in the ideal case is monocrystalline in its entire volume. In actuality, however, its volume comprises a few monocrystalline main blocks, the number of which is at most five and each of which makes up at least 20% of the volume of the raw crystal. The raw crystal is also considered to be monocrystalline if it comprises a maximum of twenty blocks, each of which has a size less than 20% of the raw crystal volume. If the number of blocks is greater than twenty, then the raw crystal is no longer considered to be monocrystalline but rather polycrystalline. Such a crystal no longer comes under the definition of "raw crystal" in the sense of this invention.

A first test or coarse visual assessment is the assessment for color. A grown raw crystal which is given a polished surface on all sides is wetted with an immersion fluid. For this, commercially available products such as silicon fluid SF 1202 made by GE Silicones or paraffin liquid reagent PhEur made by Merck (Darmstadt, Germany) can be used. The crystal is then lighted with daylight and observed merely with the naked eye. If no colors are perceptible, then shards from this crystal that occur later in the processing process are suitable for re-use.

In a further, second test, the raw crystal is tested in a darkroom for the occurrence of fluorescence. In this test, light is shown through it with a white-light lamp. The white-light lamp is preferably adjusted to be slightly divergent. If major fluorescences occur here, then shards occurring later in the processing process from this raw crystal are not suitable for re-use and are rejected.

If to an untrained eye of the observer in the darkroom, after adaptation of the eye, no fluorescence or a reddish or even bluish fluorescence is visible, which however is no longer perceptible to this observer in a normally lighted work room, then shards from this raw crystal are suitable for re-use. To determine the fluorescence, the surface of the raw crystal examined is wetted with one of the conventional immersion fluids already mentioned. In this test, the beam of the white-light lamp is preferably guided in such a way that all the parts of the volume of the crystal have light shown through them once and can thus be assessed.

As a lamp for this kind of white-light illumination, a halogen lamp made by Osram, for instance, with the tradename Xenophot HLX 54510 (12V, 50 W) is for instance used, whose beam is adjusted to be slightly divergent by means of a reflector and a condenser. The determination of the fluorescence is done as follows:

If no fluorescence whatever is found, then the crystal is assigned to fluorescence class 0. If fluorescence that is apparent only to a trained worker and after adaptation of the eye in the darkroom, then it is classified as weak or in other words is assigned to fluorescence class 1.

If the fluorescence is apparent even to a layperson in the darkroom, but is not perceptible in daylight or in a lighted room, then the fluorescence is classified as medium or class 2. Strong fluorescence, conversely, can be perceived visually by anyone readily, even outside the darkroom. Shards of raw crystals that exhibit such strong fluorescence cannot be employed for re-use. Such crystals are classified as highly fluorescent or as belonging to fluorescence class 3, and shards from them must be discarded.

Next, in the darkroom, with illumination in white light, preferably with the same lamp with which the fluorescence is determined, the diffuse scattering of the crystal is determined. Light is shown through the raw crystal throughout its volume, and the scattering is determined visually, again after adaptation of the eye to the dark room. Scattering is called diffuse if the eye of the assessor cannot resolve individual scattering sensors, and the illuminated crystal volume appears to be uniformly illuminated. Weak diffuse scattering means that it is perceptible in the darkroom only to a trained eye of one skilled in the art, while conversely, medium scattering that is no longer allowable is apparent even to a layperson. For the method of the invention, only shards from crystals that have no or only weak diffuse scattering can be re-used. Shards from crystals that have stronger diffuse scattering must be discarded.

If this characteristic is fulfilled, the raw crystal is subjected to a further test for discrete scattering. Discrete scattering means that the eye of the assessor perceives pointlike or striplike scattering centers. Such scattering centers are formed for instance by small vacuoles, or by crystal exudates. For the method of the invention, only shards that have a maximum of two scattering centers per $dm^3$ are used. Preferably, however, they have no more than one scattering center per $dm^3$, and in particular a maximum of 0.5 scattering centers per $dm^3$. For the re-use according to the invention, both diffuse and discrete scattering can be allowed to cause only a negligibly slight contribution to transmission loss. A further criterion for the re-use of shards by ascertaining the still-allowable transmission measurement is the determination, described hereinafter, of the initial decadic loss coefficient.

Shards from raw crystals that do not meet all of the above criteria must be discarded and are not usable for the production method of the invention.

In a preferred embodiment of the invention, the crystal is subjected to still further tests. A first preferred additive test pertains to the determination of small-angle grain boundaries. The term "small-angle grain boundaries" is understood to mean tilting of the crystal axes of sub-grains relative to one another within one monocrystal, forming an angle to one another of a maximum of approximately 5°. It has now been discovered that for the method of the invention, shards at the small-angle grain boundaries of which tilting of sub-grains of a maximum of 2° occurs, or in other words whose axes are tilted by a maximum of 2° relative to one another, are preferentially suitable. Preferably, however, they are tilted by no more than 1.5° and in particular by a maximum of 1°. In a very particularly preferred embodiment of the invention, however, they are tilted by no more than 0.8°. The determination of the small-angle grain boundaries is known per se and typically done in the polariscope. The raw crystal to be examined is likewise wetted using an immersion fluid and is placed between two crossed polarizers. According to the invention, the raw crystal is preferably placed with polished surfaces, and in particular surfaces polished on all sides, between the polarizers. Determining the tilting is then done using comparison bodies, whose tilt angle has been determined beforehand using X-ray diffractometry, for instance using a device known as a Crysotax probe made by Röntec. The magnitude of bright/dark phenomena of the comparison bodies is thus scaled using the measured tilt angles, and this assures that the raw crystal being examined can be assessed on the basis of bright/dark phenomena. In principle, it is also possible to determine the tilting by X-ray diffractometry for each shard, but that entails very great, unjustified effort and expense. In the method of the invention, the comparison of the bright/dark phenomena is therefore done in the polariscope. Such a polariscope may for instance be the SP 300 made by the company known as Kombinat Carl Zeiss Jena, and the examination method is described in detail in the January, 1989 issue of TGL 21792. In the professional literature as well, however, the method is described, for instance in "*Glastechnische Fabrikationsfehler*" [Manufacturing Flaws in Glass] by H. Jebsen-Marwedel and R. Brückner, Springer Verlag, 3rd Edition, 1980.

In the determination of the small-angle grain boundaries in the polariscope, the assessment of the bright/dark image is done, and then the assignment of the raw crystal to the following small-angle grain boundary classes:

0=no perceptible small-angle grain boundaries;

weak (class 1)=small-angle grain boundaries are apparent only at different angles of observation by the observer between the crossed polarizers;

medium (class 2)=small-angle grain boundaries show gray coloration in the respective region (class 2, by the calibration described above, corresponds to a tilt angle of 2°); and strong (class 3)=small-angle grain boundaries are clearly apparent between the crossed polarizers, even to laypersons.

A further, optionally additional test pertains to determining the initial decadic loss coefficients, especially at 193 nm for the energy density of zero. The determination of this initial loss coefficient is described for instance in German Patent Disclosure DE 103 35 457 A1. The transmission is ascertained with laser irradiation at different energy densities, and the measured values obtained are extrapolated to the value for an energy density of zero. This value is called the initial transmission. From it, the particular initial loss coefficient k can be calculated. In principle, it is also possible to determine the decadic loss coefficient k at 193 with a spectrometer (such as Lambda 900 made by PerkinElmer, which because of the lamp excitation employed uses a measurement beam of only very low energy density. Regardless of how the transmission value has been determined, at the energy density of zero (when lasers are used) or near the energy value of zero (when spectrometers are used), the decadic loss coefficient is determined by the following formula:

$$T=(1-R)^2 \times 10^{-kd},$$

in which

T is the total transmission, measured by means of spectrometer, or the transmission value extrapolated to an energy density of 0, from a plurality of laser measurements at different energy densities;

d represents the specimen thickness in cm; and k represents the initial decadic loss coefficient in $cm^{-1}$; and R is the reflection loss at a surface for vertical incident light. The reflection loss R is calculated as follows:

$$R = \left(\frac{n-1}{n+1}\right)^2$$

In the preferred method of the invention, all the shards from a raw crystal whose measurement specimen has a k value of $>5\times10^{-4}$ cm$^{-1}$ are discarded.

In calculating the loss coefficient k from the measured transmission by means of a specimen thickness d, k includes one loss component comprising scattering and one loss component comprising absorption. From the scattering allowed to only a limited extent in a preceding test, it is already assured that the characteristic of the loss coefficient k can additionally be utilized.

If a shard meets the characteristics stated above, it is preferably cleaned of soiling and contamination that adheres to its surface. Such contamination includes for instance labels, crystal abrasion, dust, immersion fluid, and so forth. The cleaning itself can be done either by hand or by machine.

Washing by hand is typically done by abrasion using a two-dimensional towel-like, textile construction, which in particular is free of lint and fluff, and which is saturated with a cleaning agent that contains water and/or with an organic solvent, such as alcohol, in particular ethanol. Next, the shard is rinsed with pure water, in particular distilled or deionized water, in order to remove all the residues of solvent and/or cleaning agent that still remain on the surface. After that, the shards are pre-dried in air, preferably in a dust-reduced environment, after which further drying is done in a warming oven at elevated temperature, preferably between 50 and 90°, and in particular between 60 and 80°, over a period of time of at least 60 minutes and in particular at least 75 minutes. Typical maximum drying times are 150 and in particular 120 minutes; a maximum of 100 minutes has proved to be especially expedient. After cooling, the shards can be used for another growth process.

The machine cleaning can be done either using a spray stream as in a dishwasher or by means of one or more ultrasound baths. In cleaning using a spray stream, a commercially available dishwasher is typically used. The shards are placed in the cleaning basket in such a way that they do not touch one another. The washing itself is done with super-pure water with the addition of a cleaning agent. Nonsurfactant agents and in particular nonionic cleaning agents have proven to be especially expedient. Cleaning agents that contain no alkali ions are especially preferred. A typical cleaning agent is sold under the tradename Vigon A, for instance, by Dr. Mack GmbH, Ingolstadt, Germany. The washing operation itself is done at temperatures between room temperature and approximately 90° C., and especially up to approximately 80° C. and preferably up to approximately 70° C., and over a period of time as is usually preset in dishwashers. Such periods are typically 60 minutes long at maximum. This is followed by at least two but preferably at least three rinsing operations with super-pure water; four rinsing operations have proved expedient. After air drying at at least 100° C. and in particular at least 110° C., the shards are dried in a vacuum drying oven as described above for washing by hand.

The ultrasound cleaning is typically done such that the shards are placed in the basket in such a way that they do not touch one another and are first rinsed in a flowing rinse with softened water. Next, they are placed in an ultrasound bath that contains a cleaning agent. Typical cleaning agents are for instance the same as in the spray stream cleaning in the dishwasher. A typical cleaning agent for this is N-methylpyrrolidone. The basket with the shards is preferably moved within the ultrasound cleaning bath. A typical cleaning time amounts to between 20 and 80 minutes, especially between 30 and 60 minutes, at a cleaning temperature of from room temperature to 70° C., in particular from approximately 30 to 50° C., and approximately 40° C. is preferred. After brief rinsing, this operation is repeated in a second ultrasound bath. This is followed by rinsing in a rinsing bath with constantly flowing super-pure water for a period of from approximately 2 to 10 and in particular 3 to 7 minutes; approximately 5 minutes is preferred. The temperature in rinsing is approximately 30 to 50° C., in particular approximately 40° C. This rinsing operation is repeated, and then the shards are dried as described above, first in air and then in a vacuum drying oven. The shards thus obtained are usable immediately for another growth process. If the shards must be stored for a relatively long time until being used, they are preferably stored in a vacuum, which is expediently done by sealing them in commercially available film bags.

The shards thus obtained can now be used for the crystal growth. For the crystal growth, they can be used directly and alone, using a conventional scavenger, or with the addition of typical raw material. In many cases, the production of a so-called ingot, that is, a polycrystalline large-volume body, has proved expedient. The ingot of this kind is then placed in the crystal growth assembly and melted, and from this melt the desired crystal is grown.

By means of the method of the invention, it is not only possible for expensive raw material to be re-used, but it has surprisingly also been demonstrated that with a shard selected in this way, better and cleaner crystals can be grown, which are suitable for applications with lasers at a working wavelength of below 200 nm, such as 193 nm and 157 nm. Crystals produced in this way can be tempered quite well; that is, their tendency to having increased diffuse scattering after tempering is surprisingly very slight. Because of this good tempering capability, very good values for the birefringence and the homogeneity of the refractive index are achieved, and as a result they find use above all in the projection optics of a stepper. They are furthermore especially resistant to DUV laser radiation, and for this reason they are also highly suited to use in the lighting system of a stepper.

Typical crystals obtained according to the invention have a value for diffuse scattering (bidirectional scatter distribution function value) of $<1.3\times10^{-6}$, and in particular $<7\times10^{-7}$. Such values were unobtainable until now. Especially preferred crystals of the invention have a BSDF value of <5, in particular $<3\times10^{-7}$. The determination of such BSDF values is known to one skilled in the art and is described for instance in J. C. Stover, *Optical Scattering—measurement and analysis*, McGraw-Hill, 1990. Furthermore, the crystals of the invention, after a tempering step has been performed, exhibit especially high homogeneity of the refractive index, and in particular a homogeneity in the RMS values (after the subtraction of 36 Zernike coefficients as described in International Patent Disclosure WO 2005/080948). Typical crystals of the invention exhibit an RMS homogeneity of $<15\times10^{-8}$, in particular $<10\times10^{-8}$, and $<2.5\times10^{-8}$ is preferred and $<1.5\times10^{-8}$ is especially preferred. The birefringence (SDR-RMS) amounts to preferably less than 1 nm/cm, in particular less than 0.35 nm/cm, and less than 0.3 nm/cm is especially preferred, in both a (100) and a (110) orientation. In the (111) direction, the SDR-RMS value is typically less than 0.2 nm/cm; <0.15 nm/cm and in particular <0.08 nm/cm is preferred. In the determination of the laser resistance, the crystals obtained according to the invention, on being irradiated $10\times10^9$ pulses with a laser at the wavelength of 193 nm and at an energy density of 10 mJ/cm$^2$ exhibit only a slight elevation in the loss coefficient k by less than $7\times10^{-4}$ cm$^{-1}$ (extrapolation of the measured values, obtained after the aforementioned long-term irradiation, at different energy densities corresponding to the measurement regimen described in German Patent Disclosure DE 103 35 457 A1, to an energy density (zero) in comparison to an identical measurement before the beginning of the long-term irradiation.

With the shards thus obtained, by the method described in International Patent Disclosure WO 01/064975, a monocrystal with a diameter of at least 35 cm and a height of at least 25 cm was grown. The crystal had a BSDF value of <15, namely $1.7 \times 10^{-7}$; an RMS refractive index homogeneity (after the subtraction of 36 Zernike coefficients) of <13, namely $1.4 \times 10^{-8}$, and an SDR-RMS value in the 111 direction of <0.15, namely 0.05 nm/cm.

After an irradiation with $10 \times 10^9$ pulses with a laser at a wavelength of 193 nm and an energy density of 10 mJ/cm$^2$, after another measurement of the loss coefficient k extrapolated to the energy density of zero, the elevation of this loss coefficient by $5 \times 10^{-4}$ cm$^{-1}$ compared to the measurement before the beginning of the irradiation was found.

Preferred materials for the method according to the invention are alkaline earth halides, in particular calcium fluoride, barium fluoride, and magnesium fluoride. In a further preferred embodiment, the shards have slight dopings of trivalent metal ions, which act as compensation for monovalent contaminants. These dopings are in particular of the kind described in German Patent Disclosure DE 10 2005 044 697 A1.

The crystals obtained according to the invention are especially suitable for producing optical components in DUV lithography and for producing photoresist-coated wafers, and thus for producing electronic devices. The invention therefore also pertains to their use for producing lenses, prisms, fiber optic rods, optical windows, and optical devices for DUV lithography, and in particular for producing steppers and excimer lasers and for light-exposure and projection optics and therefore also for producing integrated circuits, computer chips, and electronic devices such as computers and other devices that contain chiplike integrated circuits.

In the method of the invention, shards that have the same specification are preferably melted together. Typical specifications are shown in the following table.

| Criterion | 1 | 2 | 3 | 4 | 6 |
|---|---|---|---|---|---|
| Color | None | None | None | None | None |
| Fluorescence Class | Max. 2 | Max. 2 | Max. 2 | Max. 2 | Max. 2 |
| Fluorescence and Color of the Fluorescence | None; rba** | None; rba** | None; rba** | None; rba** | None; rba** |
| Loss Coefficient k (Laser Measurement) | $5 \times 10^{-4}$ [cm$^{-1}$] | $5 \times 10^{-4}$ [cm$^{-1}$] | at 193 nm | | |
| Loss Coefficient k (Spectrometer Measurement) at 193 nm | | | $5 \times 10^{-4}$ [cm$^{-1}$] | $5 \times 10^{-4}$ [cm$^{-1}$] | $5 \times 10^{-4}$ [cm$^{-1}$] |
| Small-Angle Grain Boundary | 2 | 2 | 2 | 2 | 2 |
| Scattering Class (Diffuse) | 0 | 1 | 1 | 1 | 1 |
| Scattering Class (Discrete) (50% *) | 0 | 0 | 0 | 1 | 1 |
| Scattering Class (Discrete) (100% *) | 0 | 0 | 0 | 0 | 1 |

* Percentage of the volume of the raw crystal tested
* rba = reddish and bluish allowed

The invention claimed is:

1. A method of producing a high-purity, large-volume monocrystal that is especially radiation-resistant with low intrinsic birefringence by generating a melt of crystalline raw material and controlled cooling with solidification of the melt, wherein the crystalline raw material comprises shards and/or waste of already-grown crystals, which 1) upon visual observation in daylight have no color; and
   2) upon illumination with a white-light lamp in a darkroom
      a) have no or at maximum a just barely perceivable reddish and/or bluish fluorescence; and
      b) have no or at maximum a just barely perceivable diffuse scattering; and
      c) have no or only slight discrete scattering of at maximum two visually perceivable scattering centers per dm$^3$.

2. The method as defined by claim 1, wherein the shards and/or the waste have a decadic loss coefficient, determined from a transmission measurement with an excimer laser at 193nm, at an energy density of zero, of $\leq 0.0005$/cm, or a decadic loss coefficient, determined from a transmission measurement with a spectrometer at 193 nm, of $\leq 0.0005$/cm.

3. The method as defined by claim 1, wherein adjacent sub-grains of the already-grown crystals have small-angle grain boundaries with a maximum tilting of crystal axes from one another of 2°.

4. The method as defined by claim 1, wherein the shards and/or the waste comprise CaF$_2$, SrF$_2$, or BaF$_2$, or mixtures thereof.

5. The method as defined by claim 1, wherein the already-grown crystals are doped with foreign ions.

6. The method as defined by claim 1, wherein the shards and/or the waste, before being melted, are treated with a cleaning agent.

7. The method as defined by claim 6, wherein the cleaning agent is CFHC, an alcohol, and/or water.

8. The method as defined by claim 6, wherein the cleaning agent contains at least one organic solvent and the least one organic solvent evaporates without leaving a residue.

* * * * *